United States Patent [19]

Atwater

[11] Patent Number: 5,640,150

[45] Date of Patent: Jun. 17, 1997

[54] RESETTABLE STATE-OF-CHARGE INDICATOR FOR RECHARGEABLE BATTERIES

[75] Inventor: Terrill B. Atwater, North Plainfield, N.J.

[73] Assignee: The United States of America as represented by the Secretary of the Army, Washington, D.C.

[21] Appl. No.: 528,628

[22] Filed: Aug. 17, 1995

[51] Int. Cl.$^6$ .................................................. G08B 21/00
[52] U.S. Cl. ........................... 340/636; 340/635; 429/90; 429/91; 324/427; 324/428
[58] Field of Search ..................... 340/635, 636; 429/90, 91, 93; 324/427, 428

[56] References Cited

U.S. PATENT DOCUMENTS

| | | | |
|---|---|---|---|
| 5,321,627 | 6/1994 | Reher | 340/636 |
| 5,325,041 | 6/1994 | Briggs | 340/636 |
| 5,345,163 | 9/1994 | Gibbons et al. | 320/48 |
| 5,357,203 | 10/1994 | Landau et al. | 340/636 |
| 5,372,898 | 12/1994 | Atwater et al. | 429/90 |
| 5,394,089 | 2/1995 | Clegg | 340/636 |
| 5,416,402 | 5/1995 | Reher et al. | 340/636 |
| 5,440,221 | 8/1995 | Landau et al. | 340/636 |

*Primary Examiner*—Jeffery Hofsass
*Assistant Examiner*—Timothy Edwards, Jr.
*Attorney, Agent, or Firm*—Michael Zelenka; George B. Tereschuk

[57] ABSTRACT

An improved state-of-charge indicator for a battery wherein the counter circuit of the battery state-of-charge indicator includes a means for both resetting and fine-tuning the counter circuit. The current flowing from the monitored battery is passed through a sensing resistor. The voltage across the resistor is amplified and integrated over time and the result of the integration is stored in a capacitor discharged by a switch whenever a threshold voltage is achieved. The cycle is repeated each time coulomb of capacity is removed from the battery. The counter circuit counts the charge/discharge cycles of the capacitor resulting in a count representative of the amount of energy dissipated and therefore indirectly of the amount of energy remaining in the battery system. In this improvement, both a resetting means and a fine-tuning means are included for the counter circuit when the battery is being recharged. The fine tuning means can be preset to reset the counter circuit upon reaching a predetermined voltage signifying that the battery is fully charged. The fine-tuning means may further comprise a zener diode used with a MOSFET mixer.

3 Claims, 4 Drawing Sheets

RESETTABLE STATE-OF-CHARGE INDICATOR FOR RECHARGEABLE BATTERIES

GOVERNMENT INTEREST

The invention described herein may be manufactured, used and licensed by or for the Government of the United States of America without the payment to me of any royalties thereon.

RELATED INVENTION

The present invention is related to U.S. Pat. No. 5,372,898, entitled "A Universal Inexpensive Battery State-of-Charge Indicator," which was filed in the name of Terrill Atwater et al., wherein I am one of the co-inventors of that patent, and which is assigned to the same assignee as the present invention.

FIELD OF THE INVENTION

The present invention relates to the field of battery energy monitoring systems and more particularly to improved state-of-charge indicators that are resettable. The purpose of this invention is to provide an improved, resettable state-of-charge indicator allowing the user to not only accurately monitor the state-of-charge of a battery and determine its status but to also allow the user to reset the indicator upon battery recharge. This invention applies to any battery system where knowledge of the battery's remaining capacity is desirable.

BACKGROUND OF THE INVENTION

Recently there has been much research into different devices and methods for conserving the energy of rechargeable batteries. The above-referenced patent discloses a discharge level monitor for batteries wherein the current is passed through a sensing resistor and the voltage across the resistor is amplified and integrated over time and the result of the integration is stored in a capacitor discharged by a switch whenever a threshold voltage is achieved. That invention discloses repeating the cycle each time 1.0 coulomb of capacity is removed from the battery and includes a counter circuit for counting the number of charge/discharge cycles of the capacitor producing a count representative of the amount of energy dissipated and therefore indirectly of the amount of energy remaining in the battery system.

It is well documented and accepted that the available energy in a battery is a function of the conditions to which the battery has been subjected. Capacity remaining is a complex function of current drain, temperature and time. Therefore, a reliable device for predicting remaining capacity has been actively sought and this need has been partially addressed in the above-referenced related patent disclosing a discharge level monitor for a battery. However, that patent's device neither addressed the need for a continuous internal means of determining capacity, which is desirable, nor provided the user the capability of resetting the monitor following battery recharging.

The above-referenced related patent's device provides an inexpensive, accurate state-of-charge indicators for high power, high energy batteries, particularly the lithium battery, but it does not address the need for providing a continuous internal means of determining battery capacity and that device is not being capable of being reset once full battery capacity is restored. Accurate state-of-charge indication can only be achieved by taking the discharge rate and temperature into account. The device provided in the above-referenced related patent could be efficiently combined with mechanisms to provide both continuous internal monitoring and resettability, and still be inexpensive, simply-implemented and accurate. The present invention discloses and claims such an improved battery state-of-charge indicator.

SUMMARY OF THE INVENTION

Accordingly, it is the principal object of the present invention to provide an improvement in the inexpensive, simplified, accurate state-of-charge indicator for a high power, high energy batteries which includes a means for fine-tuning the counter circuit and a means for resetting the indicator in order to provide reliable state-of-charge indication for subsequent cycles of a rechargeable battery.

A further object of the present invention is to provide an improvement in the inexpensive, simplified, accurate state-of-charge indicator for a high power, high energy batteries which includes a means for fine-tuning the counter circuit and a means for resetting the indicator where the fine-tuning means comprises a zener diode used with a MOSFET mixer.

By using a coulometer tuned to account for battery discharge efficiencies at varying rates and temperatures, the highly accurate, inexpensive battery state-of-charge indicator disclosed in the above-referenced patent has already been achieved. Further, by combining the already disclosed battery state-of-charge monitor with a means of resetting the coulometer, subsequent cycles of a rechargeable battery can also be monitored resulting in an improved ability to determine the battery's capacity and useful life.

The foregoing improvements and other objects of the invention are realized in accordance with the present invention with a system which advantageously combines the counting circuit of the battery state-of-charge indicator disclosed in the related patent with a MOSFET mixer and zener diode within the circuit to permit resetting the counter circuit once the battery is discharged. In the present invention, these improvements are accomplished by adding a means for fine-tuning the counter circuit when recharging the battery which can be preset to reset the counter circuit of the battery state-of-charge indicator once a predetermined voltage signifying a fully charged battery has been achieved.

Other features and advantages of the improvements afforded by the present invention will become apparent from the following description of the invention which refers to the accompanying drawings.

DETAILED DESCRIPTION

Figure 1:
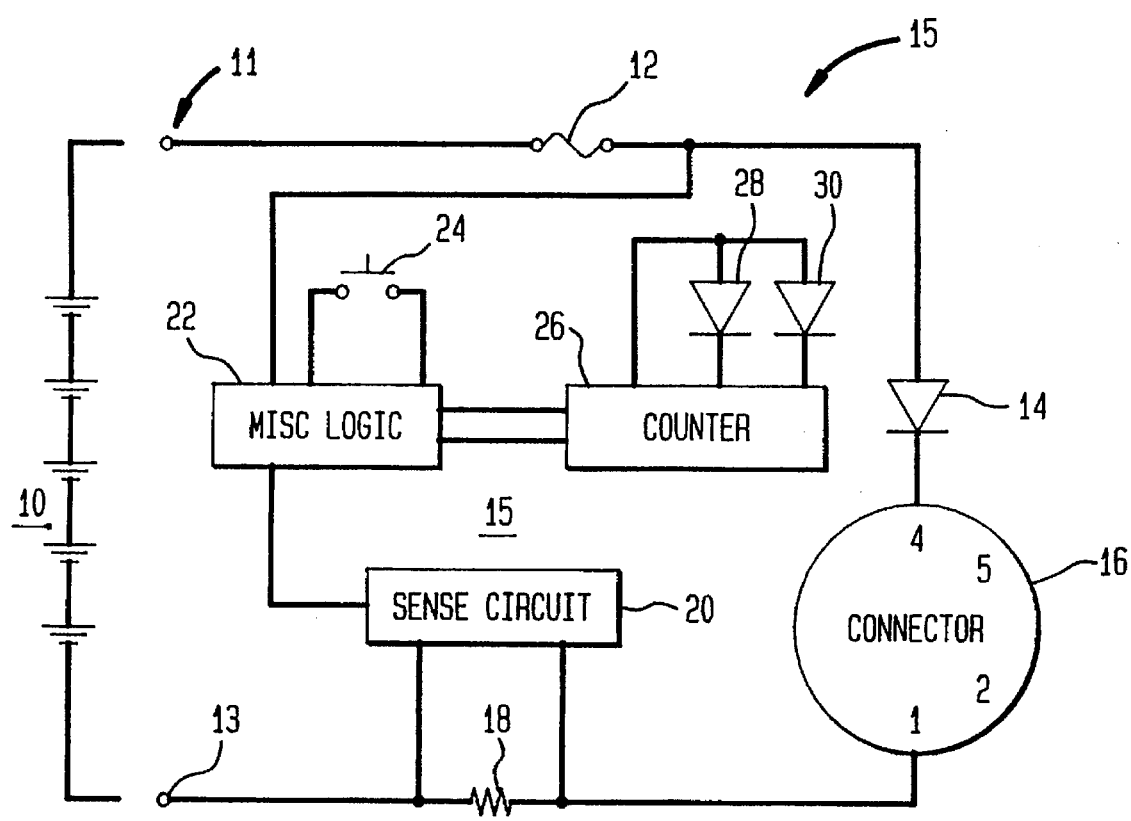
FIG. 1 is a block diagram of a universal battery state-of-charge indicator in accordance with the the prior art.
Figure 2:
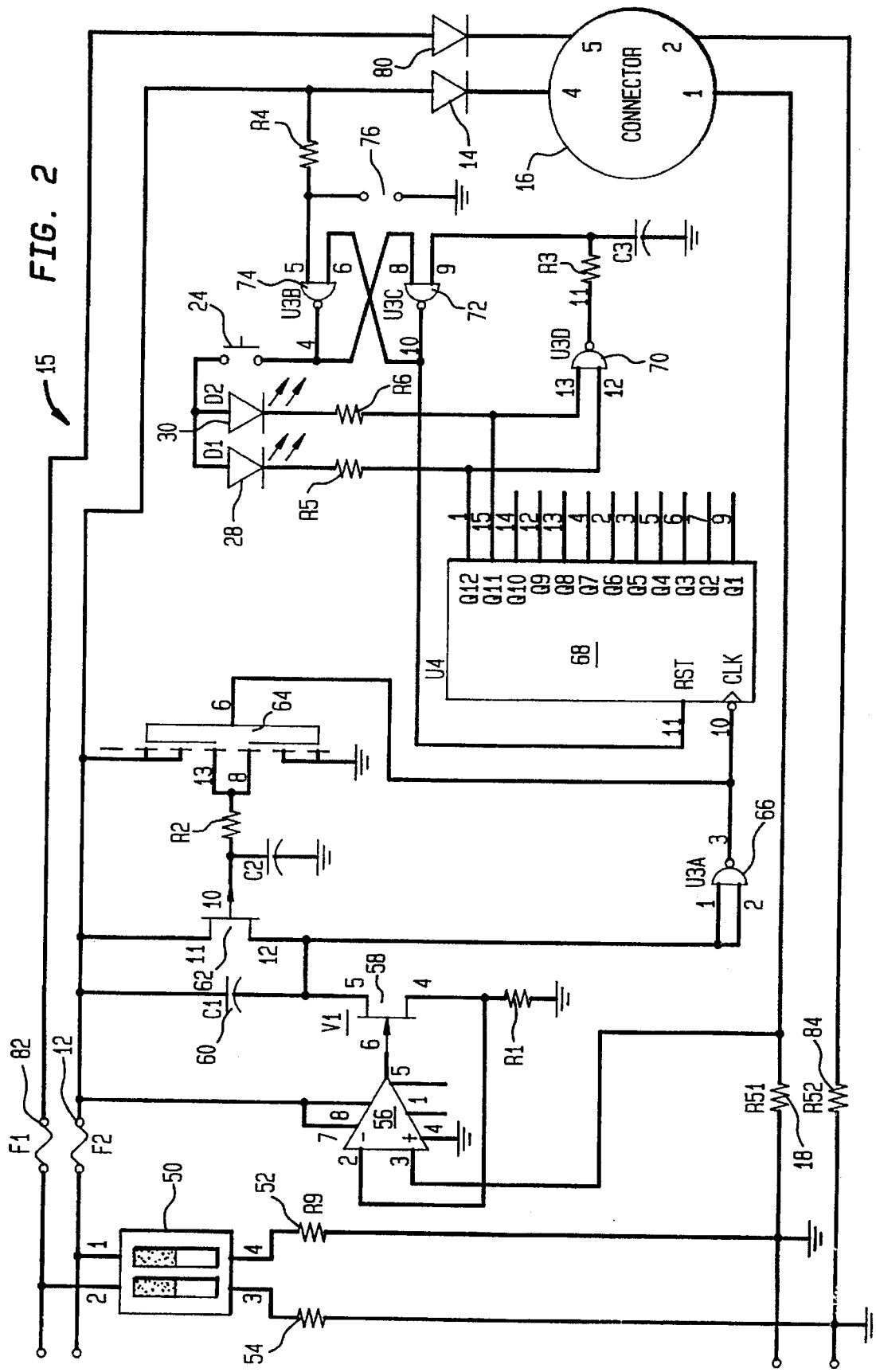
FIG. 2 depicts an electronic circuit for the the prior art universal battery state-of-charge indicator used in combination with the present invention.

Referring now to the figures, depicted thereat in FIGS. 1 and 2, respectively, is a prior art battery state-of-charge indicator disclosed in the above-referenced related Atwater et al. U.S. Pat. No. 5,372,898, entitled "A Universal Inexpensive Battery State-of-Charge Indicator," which is specifically incorporated herein by reference. FIG. 1 is a block diagram of the prior art battery state-of-charge indicator device of that related patent which is advantageously used in combination with the present invention and illustrates a battery system 10 which is connected to the universal battery state-of-charge monitor and indicator 15 via a pair of terminals 11 and 13, respectively. Positive electrical charge flows from a terminal 11 through a fuse 12 and a diode 14 to a terminal 4 of connector 16.

A load (not shown) is connected across terminals 4 and 1, respectively, of said connector 16, whereby current flowing through the load continues through a sense resistor 18 back to a negative node of said battery system 10, via said terminal 13.

A sense circuit 20 senses the voltage across said sense resistor 18, for example, a 0.1 Ohm resistor, and this voltage, which in actuality represents the current flowing through the load, is integrated and used to charge an internal capacitor which discharges and produces a pulse in a miscellaneous logic device, block 22, whenever 1.0 coulomb of energy has been dissipated by the load. At that point, said internal capacitor is immediately discharged to repeat the cycle.

Each charge/discharge cycle causes a counter circuit 26, or counter 26, to increase its count by one. A plurality of display diodes 28 and 30, respectively, are wired to the outputs of said counter 26. The logical state of the counter can be viewed by activating said diodes 28 and 30, respectively, by momentarily depressing a switch 24. Based on noting the lighting condition of said diodes 28 and 30, respectively, one determines the amount of battery life that is left. For example, when both of said diodes 28 and 30, respectively, are lit, more than 70% of the battery capacity is still available. If said diode 28 is on and said diode 30 is off, between 40 to 70% of the energy is still available. Similarly, 10-40% of the life of a battery is left when said diode 30 is lit and said diode 28 is off. When both of said diodes 28 and 30, respectively, remain off upon depressing said switch 24, the user is informed that less than 10% of the battery life remains available for use.

A detailed electrical schematic of the prior art universal battery state-of-charge indicator disclosed in the above-referenced related patent is illustrated in FIG. 2. The battery system depicted in FIG. 2 may be connected to cross a pair of terminals 11 and 13, respectively, as in FIG. 1. The current flows through a first fuse 12, a first diode 14, a connector 16 and a first sense resistor 18, as previously described with reference to FIG. 1.

The voltage across said first sense resistor 18 is sensed in an operational amplifier 56, which in conjunction with a first transistor 58, charges a capacitor 60. The operation of a second transistor 62 in conjunction with a pair of PNP transistors 64, which are configured as a differential amplifier, is such that said capacitor 60 is typically charged when current flows into the load and is discharged each time 1.0 coulomb of energy is removed from the battery.

Upon consumption of 1.0 coulomb of battery energy, the output of a NAND gate 66 produces a digital signal pulse edge at the clock input to a counter 68, thereby advancing the count by one.

When a battery monitoring system 15 is initially installed in the .prior art circuit of FIG. 2, said counter circuit 68, or counter 68, is reset to a count of 0. In time, as the number of charges/discharges of said capacitor 60 has reached a predetermined number, the Q12 and Q11 outputs of said counter 68 will toggle from the initial logical state of 0,0 to a 0,1, then 1,0 and eventually 1,1 digital values. The digital values of the Q12, Q11 outputs indicate the state-of-discharge of the battery system.

In operation of the prior art battery state-of-charge indicator, pressing a push button 24 produces the following effect. During the initial life of the battery, when the Q12, Q11 outputs are at 0,0, both of a pair of diodes 28 and 30, respectively, will be lit to indicate that more than 70% of the battery life is still available. When the output Q11 of sail counter 68 will have reached a value 1, only said diode 28 will be lit to indicate that about 40% to 70% of the battery life is still available. Still later, the value of Q12 and Q11 will reach 1,0 which is indicative of 10-40% battery energy remaining. Eventually when both Q12 and Q11 are at a digital value of "1", none of the diodes will be lit upon pressing said push button 24, indicating that less than 10% of the battery energy is available.

The function of a switch 76 is to initially reset said counter 68, and also to manually or automatically reset said counter 68, once the battery has been recharged. A plurality of AND gates 70, 72 and 74, respectively, cooperate to insure that when the output voltage of the battery is low, an expected condition near the end of battery life, said counter 68 will not accidentally reset.

Figure 3:
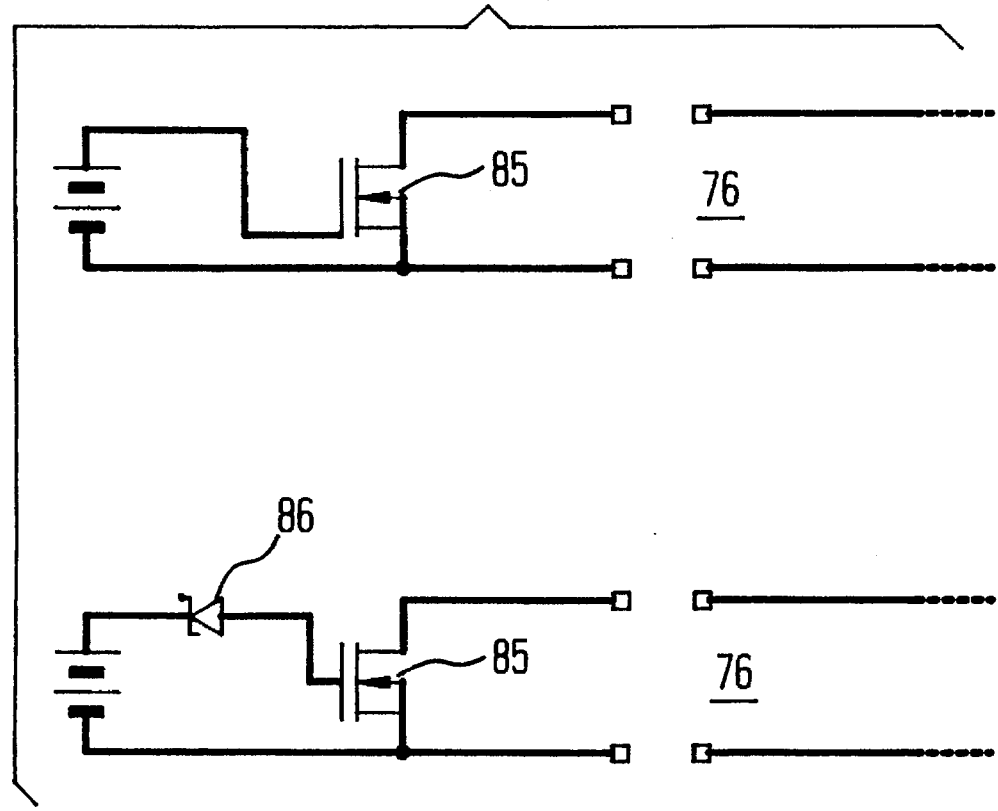
FIG. 3 depicts the improved electronic circuit of the present invention for the resetting of the battery state-of-charge indicator depicted in FIGS. 1 and 2, respectively.

This now leads to a consideration of the preferred embodiment of the present invention which discloses and claims a number of improvements to the prior art battery state-of-charge indicator depicted in FIGS. 1 and 2, respectively. Referring now to FIG. 3, the function of a MOSFET mixer 85 in the improvement of the present invention when incorporated into the circuit of FIG. 2, is to reset said counter 68 when the battery is recharged. Said MOSFET mixer 85 becomes conductive when a preset voltage is reached. By connecting said MOSFET mixer 85 across said battery terminals 11 and 13, respectively, said MOSFET mixer will become conductive when the voltage exceeds the preset voltage and nonconductive when the voltage is below the preset voltage. The conductive and nonconductive element is connected across said switch 76 providing a means for resetting said counter 68. A zener diode 86 provides a means for fine-tuning the preset voltage threshold. Other means for resetting said counter 68 and means for fine-tuning said counter 68 may also be advantageously employed in accordance with the present invention. FIG. 3 illustrates both incorporating only said MOSFET mixer 85 in the FIG. 2 circuit, as well as incorporating both said MOSFET mixer 85 and said zener diode 85 into the FIG. 2 circuit.

Note that in FIG. 2, a second fuse 82, a second diode 80 and a second sense resistor 84 are connected in parallel with said corresponding first fuse 12, first diode 14 and first sense resistor 18. A second battery system may also be connected in series with said first fuse 18, said first diode 14 and said second sense resistor 84, and its energy monitored and displayed based on the expectation that its rate of energy discharge will be identical to the first battery system actually being monitored, regardless of whether the load is connected in parallel across the two battery systems or whether the battery systems are connected in series.

A switching means 50 is a switching mechanism which includes two switches, having a first switch connected to said positive terminal 11 of one of the batteries and a second switch connected through a first resistor 52 to ground. Said second switch is connected to another battery system and to ground via a second resistor 54. When the battery system has neared the end of its useful life and it is desired to dispose of the battery, the switches in said switching means 50 are closed to assure that the battery will be fully discharged so that it will not constitute hazardous waste. This arrangement avoids complication and the extra costs associated with disposing of a partially charged battery.

Figure 4:
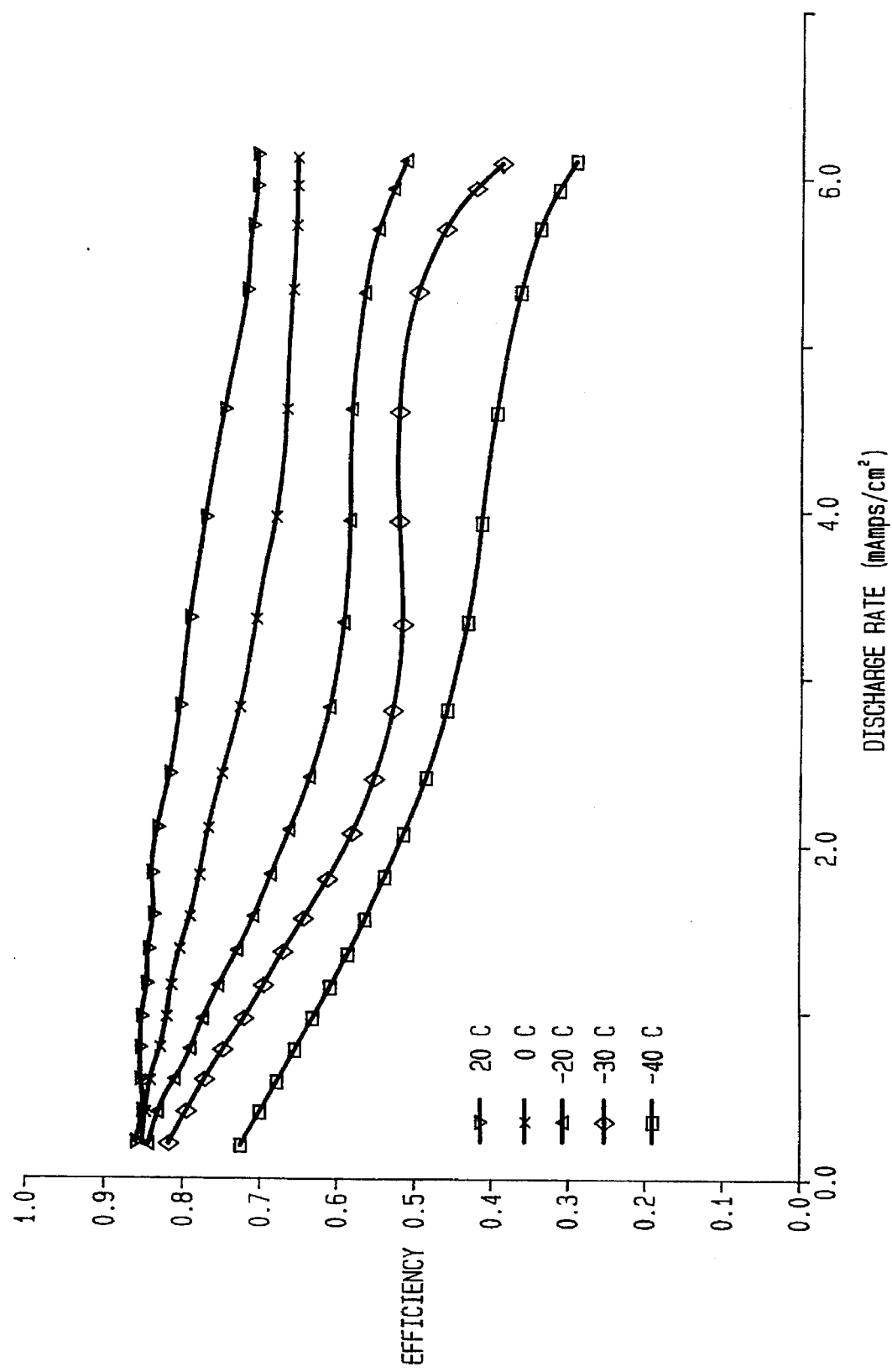
FIG. 4 is a graph representing the relationships between discharge efficiency, temperature and constant current discharge rate for lithium/sulphur dioxide cells.

FIG. 4 graphically depicts the discharge efficiency of lithium/sulphur dioxide cells, and shows the relationship between discharge relative to frequency, temperature and constant current discharge rate for lithium/sulphur dioxide cells. It can be observed at a glance that the battery efficiency is adversely impacted by lower operating temperatures as well as by greater discharge rates in accordance with the following equation:

$$E_d = \sum_{x=0}^{3} \sum_{y=0}^{3} C_{x,y} \cdot i^x \cdot T^y$$

This equation is a polynomial fit of the surface relating discharge efficiency ($E_d$) to discharge current (i) and temperature (T). $C_{x,y}$ is a calibration constant dependent on cell chemistry cell manufacturing and cell size.

Although the present invention has been described in relation to particular improvements of the preferred embodiment, many other variations and modifications and other uses will become apparent to those skilled in the art. It is preferred, therefore, that the improvements of the present invention be limited not by the specific disclosure herein, but only by the appended claims.

What I claim is:

1. An improved battery state-of-charge indicator of the type in which a current sensing means senses a current flowing from a battery to a load, a current integrator measures an amount of electrical energy flowing from said battery and produces an output indicating a predetermined amount of electrical charge having been discharged from said battery, a counter circuit counts said output of the current integrator and produces a counter output indicative of a discharge level of said battery, said counter circuit being coupled to flip-flop circuit, a display coupled to said counter circuit provides a visual indication of said discharge level of the battery, and a switching means for resetting said counter circuit when said battery is discharged are provided wherein the improvement comprises:

a means for resetting said counter circuit when recharging said battery, further comprising a means for fine-tuning said counter circuit when recharging said battery.

2. The improved battery state-of-charge indicator of claim 1, wherein said fine-tuning means can be preset to reset said counter circuit upon reaching a predetermined voltage signifying that said battery is fully charged.

3. The improved battery state-of-charge indicator of claim 2, wherein said fine-tuning means is a zener diode used with a MOSFET mixer.

* * * * *